United States Patent
Carter et al.

[11] Patent Number: 6,143,643
[45] Date of Patent: Nov. 7, 2000

[54] PROCESS FOR MANUFACTURE OF INTEGRATED CIRCUIT DEVICE USING ORGANOSILICATE INSULATIVE MATRICES

[75] Inventors: Kenneth Raymond Carter, San Jose; Craig Jon Hawker, Los Gatos; James Lupton Hedrick, Pleasanton; Victor YeeWay Lee, San Jose; Robert Dennis Miller, San Jose; Willi Volksen, San Jose; Do Yeung Yoon, Los Gatos, all of Calif.

[73] Assignee: International Business Machines Corporation, Armonk, N.Y.

[21] Appl. No.: 09/111,997

[22] Filed: Jul. 8, 1998

[51] Int. Cl.$^7$ ................................ H01L 21/4763
[52] U.S. Cl. ........................... 438/622; 438/622
[58] Field of Search ..................... 438/622, 623, 438/624, 633, 780, 781, 782, 790; 428/209; 430/110, 313; 525/108, 431

[56] References Cited

U.S. PATENT DOCUMENTS

| | | | |
|---|---|---|---|
| 5,384,376 | 1/1995 | Tunney et al. | 525/431 |
| 5,498,689 | 3/1996 | Furuta et al. | |
| 5,658,994 | 8/1997 | Burgoyne, Jr. et al. | |
| 5,714,542 | 2/1998 | Niinae et al. | 525/108 |
| 5,728,501 | 3/1998 | Nakanishi et al. | 430/110 |
| 5,747,381 | 5/1998 | Wu et al. | |
| 5,767,014 | 6/1998 | Hawker et al. | 438/623 |
| 5,773,197 | 6/1998 | Carter et al. | 430/313 |
| 5,883,219 | 3/1999 | Carter et al. | 528/310 |
| 5,895,263 | 4/1999 | Carter et al. | 438/624 |
| 5,962,113 | 10/1999 | Brown et al. | 428/209 |

FOREIGN PATENT DOCUMENTS

| | | |
|---|---|---|
| 0 755 957 A1 | 1/1997 | European Pat. Off. |
| 0 524 930 B1 | 3/1997 | European Pat. Off. |
| WO 07/01593 | 1/1997 | WIPO |
| WO 97/10193 | 3/1997 | WIPO |

OTHER PUBLICATIONS

Allen, G. et al., *Comprehensive Polymer Science. The Synthesis, Characterization, Reactions & Applications of Polymers*, vol. 1, pp. 17–18 and 34–37, Pergamon Press (Date Unknown).

Allen, G. et al., *Comprehensive Polymer Science. The Synthesis, Characterization, Reactions & Applications of Polymers*, vol. 3, pp. 34–37, Pergamon Press (Date Unknown).

*Encyclopedia of Polymer Science and Engineering. Anionic Polymerization to Cationic Polymerization, "Block Copolymers"*, 2:324–327, a Wiley–Interscience Publication (Date Unknown).

Fang, T. et al., "Polycyanate Esters: Science and Applications", *Prog. Polym. Sci.*, 20:61–118 (1995).

Frechet, J. et al., "Synthesis and Properties of Dendrimers and Hyperbranched Polymers", *Comprehensive Polymer Science*, Second Supplement, pp. 71–132, Pergamon (Date Unknown).

Gauthier, M. et al., "Uniform Highly Branched Polymers by Anionic Grafting: Arborescent Graft Polymers", *Macromolecules*, 24:4548–4553 (1991).

Tian, D. et al., "Ring–Opening Polymerization of 1,4,8–Trioxaspiro[4,6]–9–undecanone: A New Route to Aliphatic Polyesters Bearing Functional Pendent Groups", *Macromolecules*, 30:406–409 (1997).

Tomalia, D. et al., "Comb–Burst Dendrimer Topology. New Macromolecular Architecture Derived from Dendritic Grafting", *Macromolecules*, 24:1435–1438 (1991).

Tomalia, D. et al., "Genealogically Directed Synthesis: Starburst/Cascade Dendrimers and Hyperbranched Structures", *Topics in Current Chemistry*, 165:193–313 (1993).

*Primary Examiner*—David Nelms
*Assistant Examiner*—David Nhu
*Attorney, Agent, or Firm*—Scully, Scott, Murphy, Presser; Daniel P. Morris

[57] ABSTRACT

The invention relates to a process for forming an integrated circuit device comprising (i) a substrate; (ii) metallic circuit lines positioned on the substrate and (iii) a dielectric material positioned on the circuit lines. The dielectric material comprises porous organic polysilica.

20 Claims, 2 Drawing Sheets

PROCESS FOR MANUFACTURE OF INTEGRATED CIRCUIT DEVICE USING ORGANOSILICATE INSULATIVE MATRICES

FIELD OF THE INVENTION

The invention generally relates to a process for manufacturing an integrated circuit device. More specifically, the invention relates to processes for forming porous organosilicate insulative layers using functionalized linear polymers.

BACKGROUND OF THE INVENTION

There is a continuing desire in the microelectronics industry to increase the circuit density in multilevel integrated circuit devices e.g., memory and logic chips, thereby increasing their performance and reducing their cost. In order to accomplish this goal, there is a desire to reduce the minimum feature size on the chip e.g., circuit linewidth, and also to decrease the dielectric constant of the interposed dielectric material to enable closer spacing of circuit lines without increase in crosstalk and capacitive coupling. Further, there is a desire to reduce the dielectric constant of the dielectric materials such as utilized in the back end of the line (BEOL) portion of integrated circuit devices, which contain input/output circuitry, to reduce the requisite drive current and power consumption for the device. The present dielectric is silicon dioxide which has a dielectric constant of about 4.0. This material has the requisite mechanical and thermal properties to withstand processing operations and thermal cycling associated with semiconductor manufacturing. However, it is desired that dielectric materials for future integrated circuit devices exhibit a lower dielectric constant (e.g., <3.0) than exhibited by current silicon dioxide.

It is therefore an object of the invention to provide an improved integrated circuit device comprising an improved dielectric material.

Other objects and advantages will be apparent from the following disclosure.

SUMMARY OF THE INVENTION

The invention relates to a process for forming an integrated circuit device comprising (i) a substrate; (ii) interconnecting metallic circuit lines positioned on the substrate and (iii) a dielectric material positioned contiguous to the circuit lines (over and/or between the circuit lines). The dielectric material comprises a porous organic polysilica formed by the process of the invention. Preferably, the dielectric material has pore sizes less than 1000 Å, preferably less than 500 Å.

A more thorough disclosure of the invention is presented in the detailed description and from the accompanying drawings which follow.

DETAILED DESCRIPTION OF THE INVENTION

Figure 1:
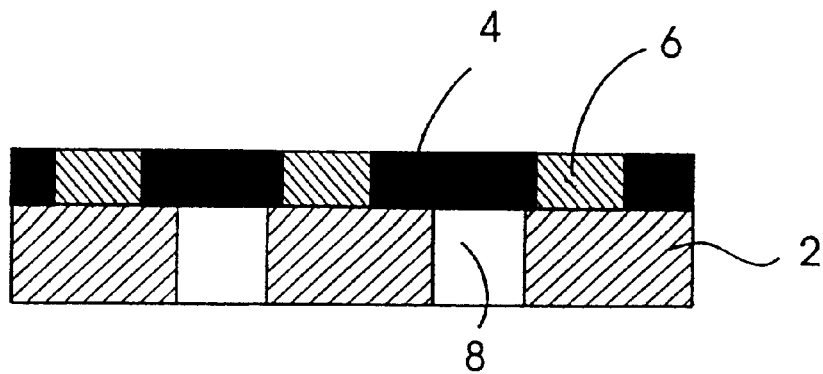
FIG. 1 is a cross-sectional view of a portion of the integrated circuit device formed by the process of the present invention.

An embodiment of the integrated circuit device formed by the process of the invention is shown in FIG. 1. The device generally comprises substrate 2, metallic circuit lines 4 and dielectric material 6. The substrate 2 has vertical metallic studs 8 formed therein. The interconnected circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the invention comprise silicon, silicon dioxide, glass, silicon nitride, ceramics, aluminum, copper and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive, material such as copper, aluminum, tungsten, gold, silver, or alloys thereof. Optionally, the circuit lines may be coated with a metallic liner such as a layer of nickel, tantalum or chromium or other layers such as barrier or adhesion layers (e.g., SiN, TiN).

The key feature of the invention is forming the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises porous organic polysilica.

Organic polysilica is a polymeric compound comprising silicon, carbon, oxygen and hydrogen atoms. Suitable organic polysilica include (i) silsesquioxanes (ii) partially condensed alkoxysilanes (e.g., partially condensed by controlled hydrolysis tetraethoxysilane having an Mn of about 500 to 20,000); (iii) organically modified silicates having the composition $RSiO_3$ and $R_2SiO_2$ wherein R is an organic substituent and (iv) partially condensed orthosilicates having the composition $SiOR_4$. Silsesquioxanes are polymeric silicate materials of the type $RSiO_{1.5}$ where R is an organic substituent.

Suitable organic polysilica include organic polysilica such as silsesquioxane. Suitable silsesquioxanes for the invention are alkyl (e.g., methyl); aryl (e.g., phenyl) or alkyl/aryl silsesquioxanes which are commercially available (e.g., GR650 and GR950 from Techniglass, Perrysburg, Ohio). Other suitable silsesquioxanes will be known to those skilled in the art such as disclosed in U.S. Pat. No. 5,384,376, and Chem. Rev. 95, 1409–1430 (1995), the disclosures of which are incorporated herein by reference for all purposes.

The porous organic polysilica dielectric composition is formed in a three-step process. The first step involves dissolving uncondensed or partially condensed organic polysilica in a suitable high boiling solvent (e.g., pm-acetate, γ-butyrolactone, cyclohexanone etc., N-methyl-2-pyrrolidone, NMP) at room temperature and then uniformly dispersing in the solution a suitable decomposable polymer. The decomposable polymer is radiation decomposable or preferably thermally decomposable. The radiation decomposable polymer decomposes upon exposure to radiation e.g., ultraviolet, x-ray, electron beam or the like. The thermally decomposable polymer undergoes thermal decomposition at a temperature above the condensation temperature of the organic polysilica.

Suitable decomposable polymers include linear polymers, which have been functionalized to provide reactive end groups and/or chain functionality. Functionalized linear polymers are capable of interacting with the organosilicate to form discrete nanostructures. Well defined linear polymers with controlled molecular weight, polydispersity, and number of functional groups along the backbone permit the interaction between the two materials to be accurately controlled and manipulated. This allows the phase separation to be fine tuned, which permits nanophase separation to be obtained. The synthesis of the functionalized linear polymers has been demonstrated by the preparation of random copolymers of methyl methacrylate, N,N-dimethyl acrylamide and 2-hydroxyethyl methacrylate among others which form nanostructures with organosilicates. Other controlled linear polymers can be generated by ring opening polymerization of lactones. These copolymers are sufficiently thermally stable to allow vitrification of the organosilicate component in the hybrids, yet decompose quantitatively at elevated temperatures to leave behind the templated nanoporosity.

Suitable linear polymers are polyethers such as polypropylene oxide; polyacrylates such as poly(methyl methacrylate); aliphatic polycarbonates such as poly (propylene carbonate); polyethylene carbonate, polyesters; polysulfones and polystyrene or poly ( -methyl styrene). The decomposable linear polymer will preferably have reactive end groups and/or reactive chain functionality which will interact and/or react (co-condense) with the organic polysilica such as a trialkoxysilayl, hydroxy, carboxy, or amino groups.

For the generation of nanoscopic structures, and subsequently nanoporous low-conductivity dielectric materials formulated according to the invention, a number of parameters are critical. Preferably the molecular weight of the linear polymers used ranges from $M_n$, 1000–100,000, and more preferably 1000–15000.

Furthermore, the polymers of the invention preferably have a low polydispersity that is between about 1.0 and 2.0, and preferably between about 1.0 and 1.4.

Additionally, the functional groups are distributed along the backbone and/or at the chain ends and are capable of interacting or undergoing reaction with the inorganic matrix. For a linear polymer with a degree of polymerization, DP, of n the number of functional groups can be between 1 and n, though preferable 2 and 100. The number of these functional groups should be controlled accurately. For non-homopolymer materials, these functional groups can either be randomly distributed along the backbone, in a tapered random copolymer configuration, or in a block copolymer configuration in which the number of individual blocks is 2 or greater.

The backbone polymer is from a list that includes vinyl polymers such as poly (acrylates or methacrylates), polyesters such as poly(caprolactones), and polyethers such as polypropylene oxide, etc. A general features of all of these backbones is that they undergo complete decomposition at 450° C. or below to give volatile products and do not leave residue in the cured inorganic matrix.

The choice of the functional groups that are capable of interacting or undergoing reaction with the inorganic matrix are carboxylic acid, phenol, hydroxy, o-diphenolic, salicylic, aryl and alkyl esters, anhydride, amide, amino, anilino, cyano, isocyanate, imines, ketone, aldehyde, trialkoxysilyl, dialkoxysilyl, monoalkoxysilyl, trichlorosilyl, dichlorosilyl, monochlorosilyl, epoxy and mixtures thereof.

In the second step of the process of the present invention, the mixture of the organic polysilica and decomposable polymer is heated to an elevated temperature e.g., directly or in a step-wise fashion (e.g., 200° C. for 2 hrs. and then ramped up (5° C./min.) to 300° C. and held for 2 hrs.) to cause condensation of the organic polysilica and preferably cross condensation with the reactive groups of the thermally decomposable polymer. The heating in the second step is below the thermal decomposition temperature of the decomposable polymer. A catalyst may be utilized to lower the condensation temperature.

The last step of the process of the present invention involves decomposing the decomposable polymer uniformly dispersed within the matrix of the condensed rigid organic polysilica. Photochemically labile polymer can be decomposed by exposure of the composition to suitable radiation to cause photodecomposition. Thermally decomposable polymer is decomposed by heating the composition to a temperature at or above the thermal decomposition temperature of the polymer. (e.g., about 350–400° C.)

The decomposable polymer decomposes to volatile fragments which diffuse out of the rigid polysilica matrix leaving voids behind. The pore size in the polysilica matrix will be generally the same size as the size of the domains of the decomposable polymer in the hybrid materials and the pore size can be altered by varying the molecular weight, degree of functionalization, and/or relative concentration of the decomposable polymer.

The dielectric composition of the present invention has a dielectric constant less than 3.2 and preferably less than 2.8 at 25° C. The composition comprises about 10 to 50%, preferably about 15% to 25% by volume of pores and has pore sizes less than 1000 Å, preferably less than 500 Å, which result in enhanced mechanical toughness and crack resistance and isotropic optical properties and improved dielectric properties. Further the dielectric composition has mechanical properties that resist cracking and enable it to be chemically/mechanically planarized to facilitate lithographic formation of additional circuit levels in multilevel integrated circuit devices. The dielectric composition has a dielectric strength from 1–5 MV/cm. The dielectric composition is optically clear and adheres well to itself and other substrates. The dielectric composition undergoes minimal shrinkage after removal of the solvent during heating. The composition of the present invention can also be utilized as a protective coating for optical articles such as glasses, contact lens and solar reflectors and other articles used in outer space.

Figure 2:
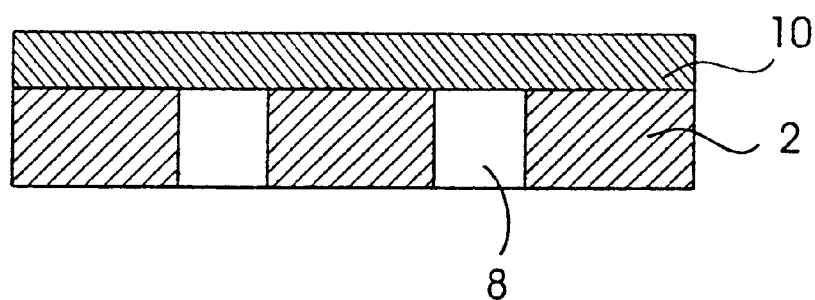
FIGS. 2–5 show a process for making the integrated circuit device of the present invention.

The present invention relates to processes for manufacturing the integrated circuit device. Referring to FIG. 2, the first step of one process embodiment involves disposing on a substrate 2 a layer 10 of the dielectric composition of the present invention comprising organic polysilica and decomposable polymer. The substrate 2 is shown with vertical metallic studs 8. The composition is dissolved in a suitable solvent such as dimethyl propylene urea (DMPU), NMP, PM-acetate, γ-butyrolactone or the like and is applied to the substrate by art known methods such as spin or spray coating or doctor blading.

The second step of the process involves heating the composition to an elevated temperature to cross condense the polysilica silyl reactive groups. The composition can be heated in the presence of a base such as an amine or Bronsted base to lower the condensation temperature. The base catalyzes both condensation extension of the polysilica and any cross condensation with the decomposable polymer enabling a lower initial cure temperature. Suitably, the base is an organic amine. The amine will preferably have a high boiling point and is removable by heating upon completion of the reaction. A suitable base is N-methyldiethanolamine. Other suitable bases will be known to those skilled in the art such as disclosed in U.S. Pat. No. 5,206,117, the disclosure of which is incorporated herein by reference for all purposes. Other catalysts which facilitate the condensation may also be used. The last step involves decomposing the decomposable polymer dispersed within the rigid polysilica matrix to form the porous polysilica.

Figure 3:
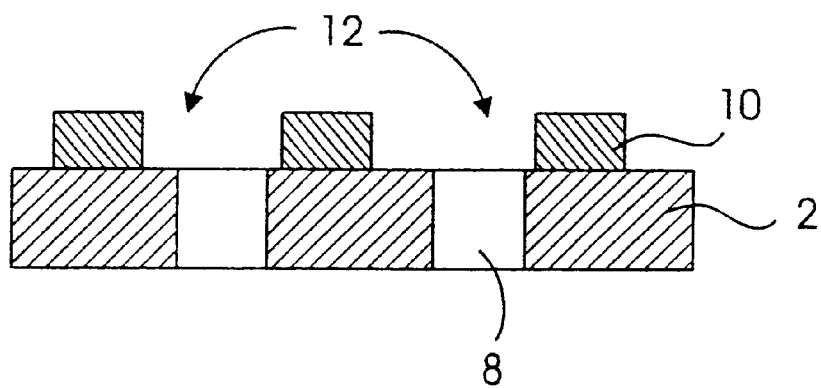

Referring to FIG. 3, the next step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist), (ii) imagewise exposing (through a mask) the photoresist to radiation such as electromagnetic e.g., visible, UV or deep UV, (iii) developing the image in the resist e.g., with suitable basic developer and (iv) transferring the image through the layer 10 of dielectric composition to the substrate 2 with a suitable transfer technique such as reactive ion etching. (RIE) Suitable lithographic patterning techniques are well known to those skilled in the art such as disclosed in "Introduction to Microlithography", Thompson et al., (1994), the disclosure which is incorporated herein by reference for all purposes.

Figure 4:
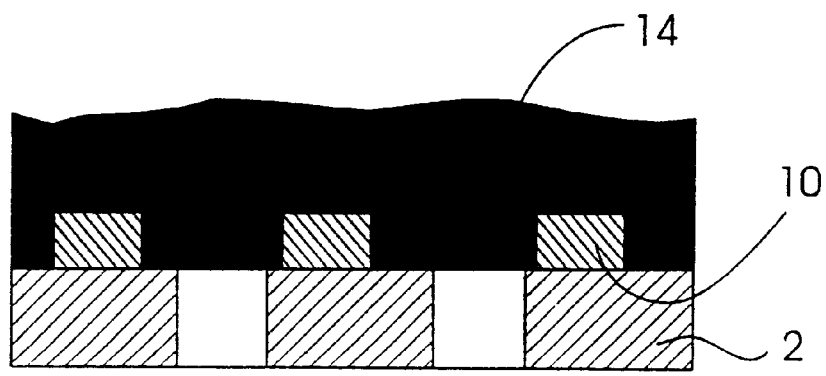

Referring to FIG. 4, in the next step of the process for forming the integrated circuit of the present invention, a metallic film 14 and removing excess metal is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
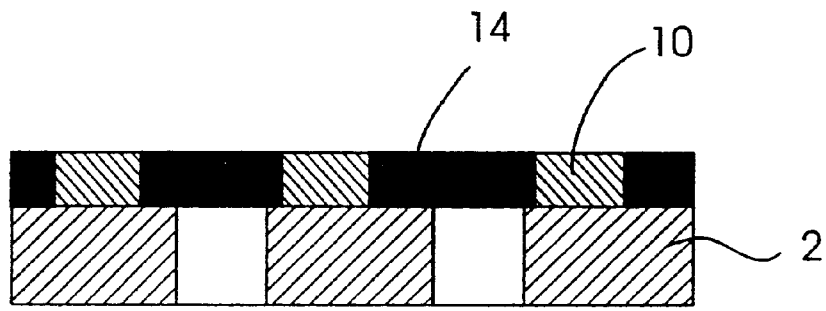

Referring to FIG. 5, the last step of the process involves removal of excess metallic material (e.g., planarizing the metallic film 14) so that the features 14 are generally level with the patterned dielectric layer 10. Planarization can be accomplished using chemical/mechanical polishing or selective wet or dry etching. Suitable chemical/mechanical polishing techniques will be known to those skilled in the art.

Figure 6:
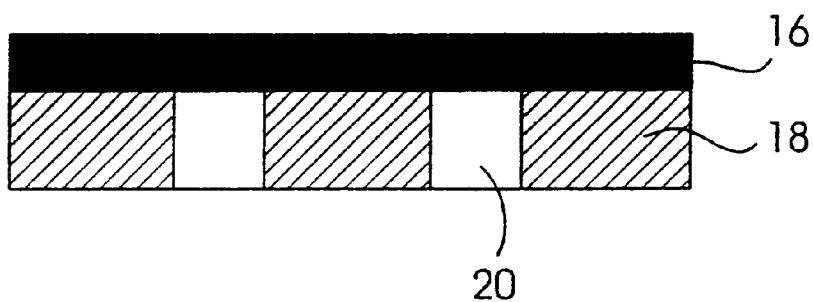
FIGS. 6–8 show an alternative process for making the integrated circuit device of the present invention.
Figure 7:
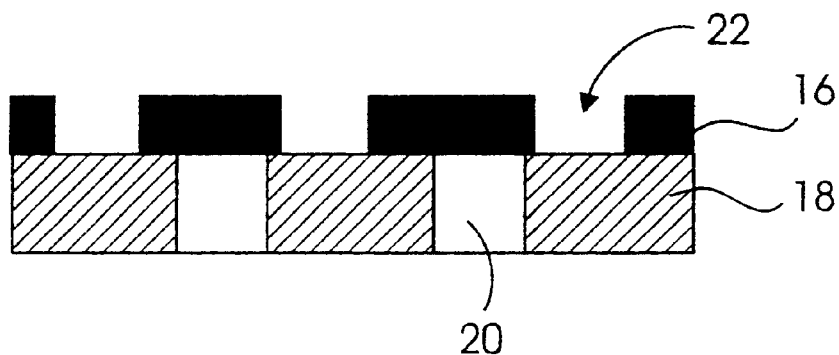
Figure 8:
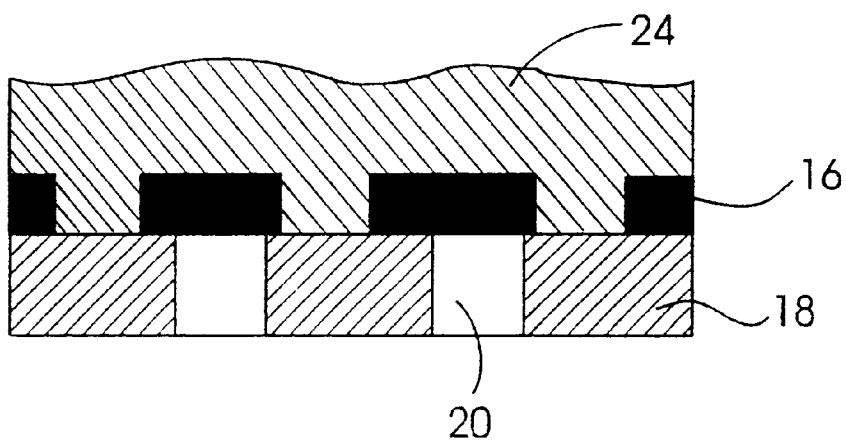

Referring FIGS. 6–8, there is shown an alternative embodiment of the process of the present invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the next step of the process, a layer 24 of dielectric composition of the present invention is deposited onto the patterned metallic film 16. In the last step of the process, the composition is heated first to condense the polysilica and then at a higher temperature to decompose the thermally decomposable polymer. Optionally, the dielectric layer may then be planarized for subsequent process in a multilayer integrated circuit. The planarized dielectric may be capped with insulators such as $SiO_2$, SiN, TiN and the like.

WORKING EXAMPLES

The following examples are detailed descriptions of the process of the present invention. The detailed preparations fall within the scope of, and serve to exemplify, the more generally described methods set forth above. The examples are presented for illustrative purposes only, and are not intended as a restriction on the scope of the invention.

EXAMPLE 1

Poly(caprolactone) is modified through the selective introduction of hydroxyl groups along the polymer chain. This is accomplished with the monomer B-ethylene ketal ε-caprolactone. This monomer is polymerized randomly or sequentially to form either random or block copolymers using an organometallic promoter such as aluminum isopropoxide. After polymerization the ethylene ketal pendant groups is selectively converted to ketones and hydroxyl pendant groups. These transformations are quantitative and occur without degradation to the polyester chain. The polymers are thermally unstable and decompose quantitatively.

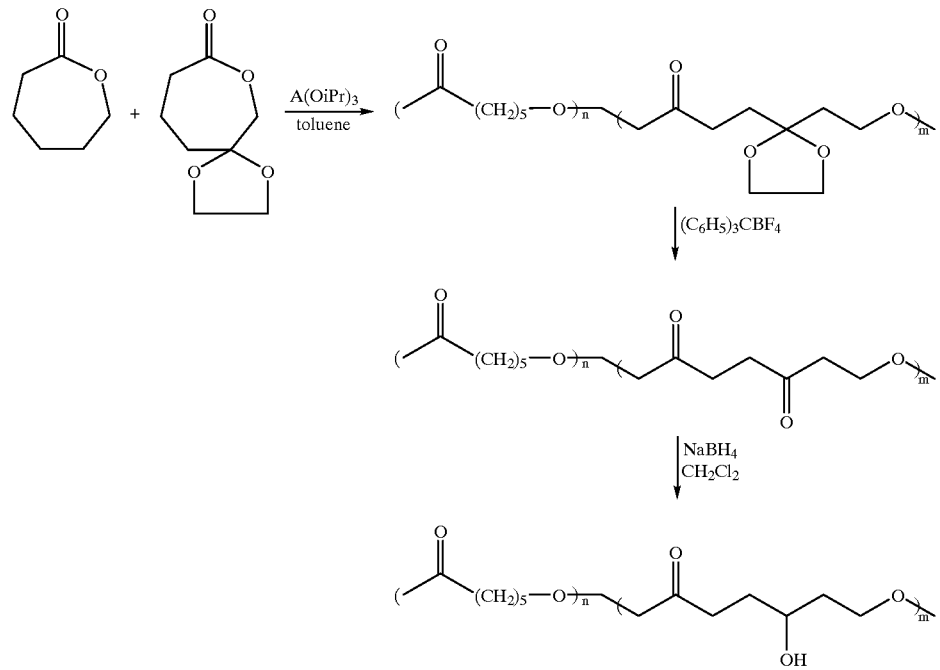

EXAMPLE 2

Free radical techniques are used to polymerize vinyl monomers bearing functional groups capable of interacting with the thermosetting matrix. Methyl methacrylate and hydroxy ethyl methacrylate are copolymerized by atom transfer radical polymerization, (ATRP) where the hydroxyl functionality is varied by the initial hydroxy ethyl methacrylate concentration. These polymers decompose cleanly and quantitatively in the appropriate temperature regime. Other comonomers capable of copolymerization with methyl methacrylate include various acrylates, functional poly(ethylene oxide), methacrylic acid, styrene, functionalized styrene, methyl acrylamide and others. Alternatively controlled polymerization may be achieved by living free radical polymerization employing alkoxyamines or nitroxides. Controlled block copolymers may be produced by coupling ring opening polymerzation and living free radical techniques.

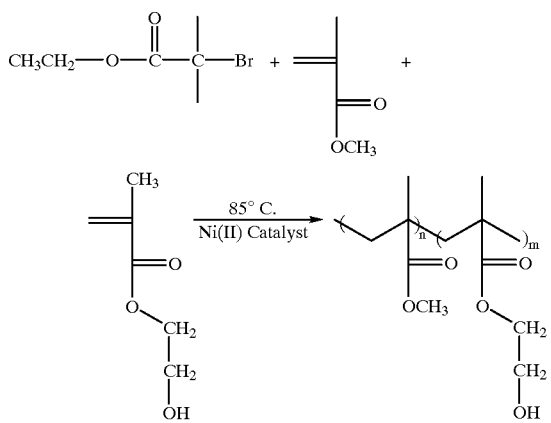

Either of the polymer systems of Examples 1 or 2 can be used in accordance with the process of the invention.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A process for forming an integrated circuit comprising:
   (a) positioning a layer of a dielectric composition, said composition comprising a decomposable linear polymer having a number average molecular weight in the range of between 1,000 and 100,000 and an organic polysilica on a substrate;
   (b) heating said composition to condense said polysilica;
   (c) decomposing said decomposable linear polymer;
   (d) lithographically patterning said layer of said dielectric composition;
   (e) depositing a metallic film onto said patterned dielectric layer; and
   (f) planarizing said film to form an integrated circuit.

2. The process of claim 1 wherein said decomposable linear polymer is decomposed by heating or exposure to radiation.

3. The process of claim 2 wherein said organic polysilica is silsesquioxane.

4. The process of claim 3 wherein said silsesquioxane is alkyl/phenyl silsesquioxane.

5. The process of claim 2 wherein said decomposable linear polymer is selected from the group consisting of a polyester, a polystyrene, a poly(methylstyrene), a poly (acrylate), a polymethacrylate, a polyether, a polycarbonate, derivatives thereof and mixtures thereof.

6. The process of claim 1 wherein decomposable linear polymer comprises functional groups selected from the group consisting of carboxylic acid, phenol, hydroxy, o-diphenolic, salicylic, aryl esters, alkyl esters, anhydride, amino, anilino, cyano, isocyanate, imines, ketone, aldehyde, alkoxysilyl, halo silyl, epoxy, and mixtures thereof.

7. A process for forming an integrated circuit comprising:
   (a) depositing a metallic film on a substrate;
   (b) lithographically patterning said metallic film;
   (c) depositing a layer of a dielectric composition comprising a decomposable linear polymer having a number average molecular weight in the range of between 1,000 and 100,000 and an organic polysilica on said patterned metallic film;
   (d) heating said composition to condense said polysilica; and
   (e) decomposing said decomposable linear polymer.

8. The process of claim 7 wherein said decomposable linear polymer is decomposed by heating or exposure to radiation.

9. The process of claim 8 wherein said organic polysilica is silsesquioxane.

10. The process of claim 9 wherein said silsesquioxane is alkyl/phenyl silsesquioxane.

11. The process of claim 9 wherein said decomposable linear polymer is selected from the group consisting of a polyester, a polystyrene, a poly(methylstyrene), a poly (acrylate), a polymethylacrylate, a polyether, a polycarbonate, derivatives thereof and mixtures thereof.

12. The process of claim 7 wherein said linear decomposable polymer comprises functional groups selected from the group consisting of carboxylic acid, phenol, hydroxy, o-diphenolic, salicylic, aryl esters, allyl esters, anhydride, amino, anilino, cyano, isocyanate, imines, ketone, aldehyde, alkoxysilyl, halo silyl, epoxy, and mixtures thereof.

13. The process of claim 1 wherein said decomposable linear polymer has a number average molecular weight in the range of between 1,000 and 15,000.

14. The process of claim 13 wherein said decomposable linear polymer includes between 2 and 100 functional groups.

15. The process of claim 1 wherein said decomposable linear polymer is the reaction product of $\epsilon$-caprolactone and $\beta$-ethylene ketal $\epsilon$-caprolactone, in the presence of an organometallic promoter.

16. The process of claim 1 wherein said decomposable linear polymer is the atom transfer radical polymerization product of methyl methacrylate and hydroxyethyl methacrylate.

17. The process of claim 7 wherein said decomposable linear polymer has a number average molecular weight in the range of between 1,000 and 15,000.

18. The process of claim 17 wherein said decomposable linear polymer includes between 2 and 100 functional groups.

19. The process of claim 7 wherein said decomposable linear polymer is the reaction product of $\epsilon$-caprolactone and $\beta$-ethylene ketal $\epsilon$-caprolactone in the presence of an organometallic promoter.

20. The process of claim 7 wherein said decomposable linear polymer is the atom transfer radical polymerization product of methyl methacrylate and hydroxyethyl methacrylate.

* * * * *